(12) United States Patent
Zou

(10) Patent No.: US 11,137,441 B2
(45) Date of Patent: Oct. 5, 2021

(54) DEVICE FOR TESTING ELECTRONIC DEVICES IN ADJUSTABLE AND ACCURATE SIMULATION OF REAL-WORLD ENVIRONMENTS

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Cun-Wei Zou, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

(*) Notice: Subject to any disclaimer, the term of this patent is extended or adjusted under 35 U.S.C. 154(b) by 79 days.

(21) Appl. No.: 16/596,230

(22) Filed: Oct. 8, 2019

(65) Prior Publication Data
US 2021/0011075 A1    Jan. 14, 2021

(30) Foreign Application Priority Data
Jul. 11, 2019   (CN) .......................... 201910623145.X

(51) Int. Cl.
*G01R 31/28*        (2006.01)
(52) U.S. Cl.
CPC ................ *G01R 31/2849* (2013.01)
(58) Field of Classification Search
CPC ........ F24F 11/30; F24F 2110/10; F24F 11/63; F24F 12/006; F24F 2110/20; F24F 2120/20; F24F 3/14; F24F 11/0008; F24F 2221/12; F24F 5/0007; F24F 11/74; F24F 2012/007; F24F 11/83; F24F 12/001; F24F 13/04; F24F 13/08; F24F 2130/00; F24F 2221/54; F24F 6/00; F24F 7/007; F24F 7/06; F24F 3/153; F24F 34/4405; H05K 7/20745; H05K 7/20836; H05K 7/20754; H05K 7/2079; H05K 7/20554; H05K 7/20618;
(Continued)

(56) References Cited

U.S. PATENT DOCUMENTS 3,870,873 A * 3/1975 Mallory ................. A01K 1/031
                                                              362/2
4,399,107 A * 8/1983 Bose ..................... F01N 3/2882
                                                              422/170
(Continued)

FOREIGN PATENT DOCUMENTS

JP          H 07108182      *  4/1995

*Primary Examiner* — Vinh P Nguyen
(74) *Attorney, Agent, or Firm* — ScienBiziP, P.C.

(57) ABSTRACT

A device for testing performance of main boards of electronic devices includes a housing, two bases, a control device, a humidifier, a heating device, and a refrigerating device. A cavity in the housing comprises separated first and second portions. The heating device is interconnected with the first portion to create a predefined high temperature environment and the refrigerating device is interconnected with the second portion to create a predefined low temperature environment. The humidifier is interconnected with the first portion and the second portion, and configured to create predefined degrees of humidity respectively in the first portion and the second portion. The bases are inside the first portion and the second portion, and electrically connected to the control device.

14 Claims, 3 Drawing Sheets

(58) Field of Classification Search
CPC ............ G05B 15/02; G05B 2219/2614; F24D 2220/042; G06F 2200/201; G01K 1/02; F24H 3/02; F24H 3/0417; F24H 9/0063; F24H 9/0073; F28F 13/06; F28F 1/00; F28F 21/065; F28F 27/00; F28F 9/00; F28F 9/0246; F28F 2280/10; F28F 3/12; B01L 11/02; B01L 7/00; G01R 31/2849; G01R 31/26; F25D 17/06; F25B 29/00; F25B 2600/0251; G01N 17/002
See application file for complete search history.

(56) References Cited

U.S. PATENT DOCUMENTS

| | | | | |
|---|---|---|---|---|
| 4,812,750 A * | 3/1989 | Keel | ................... | G01M 99/002 |
| | | | | 312/296 |
| 5,510,705 A * | 4/1996 | Langrish | .............. | G01R 31/001 |
| | | | | 324/600 |
| 6,675,528 B2 * | 1/2004 | Jablin | ..................... | A01M 1/02 |
| | | | | 43/107 |
| 10,495,565 B2 * | 12/2019 | Supp | ..................... | G01N 17/002 |
| 10,663,189 B2 * | 5/2020 | Zlobinsky | ................ | F24F 11/30 |

\* cited by examiner

DEVICE FOR TESTING ELECTRONIC DEVICES IN ADJUSTABLE AND ACCURATE SIMULATION OF REAL-WORLD ENVIRONMENTS

FIELD

The subject matter herein generally relates to main board testing.

BACKGROUND

Electronic products are widely used. The service life of main boards of electronic devices remain unpredictable. This is not only because of inherent defects but also because of external factors such as temperature and humidity.

The testing of an electronic device at different temperatures or humidity is usually to place the electronic device in a real environment, which is slow and expensive.

BRIEF DESCRIPTION OF THE DRAWINGS

Implementations of the present technology will now be described, by way of embodiments, with reference to the attached figures.

DETAILED DESCRIPTION

The present disclosure is made in conjunction with the accompanying drawings. Specific embodiments of the present disclosure are described.

In the following description, when an element is described as being "fixed to" another element, the element can be fixed to another element with or without intermediate elements. When an element is described as "connecting" another element, the element can be connected to the other element with or without intermediate elements.

Without a given definition otherwise, all terms used have the same meaning as commonly understood by those skilled in the art. The term "and/or" means including any and all combinations of one or more of associated listed items. The terms such as "upper", "lower", "lower", "left", "right", and the like are only used to indicate relative positional relationships of objects, and when an absolute position of an object to be described is changed, relative positional relationships of the object to other objects are also changed accordingly.

Figure 1:
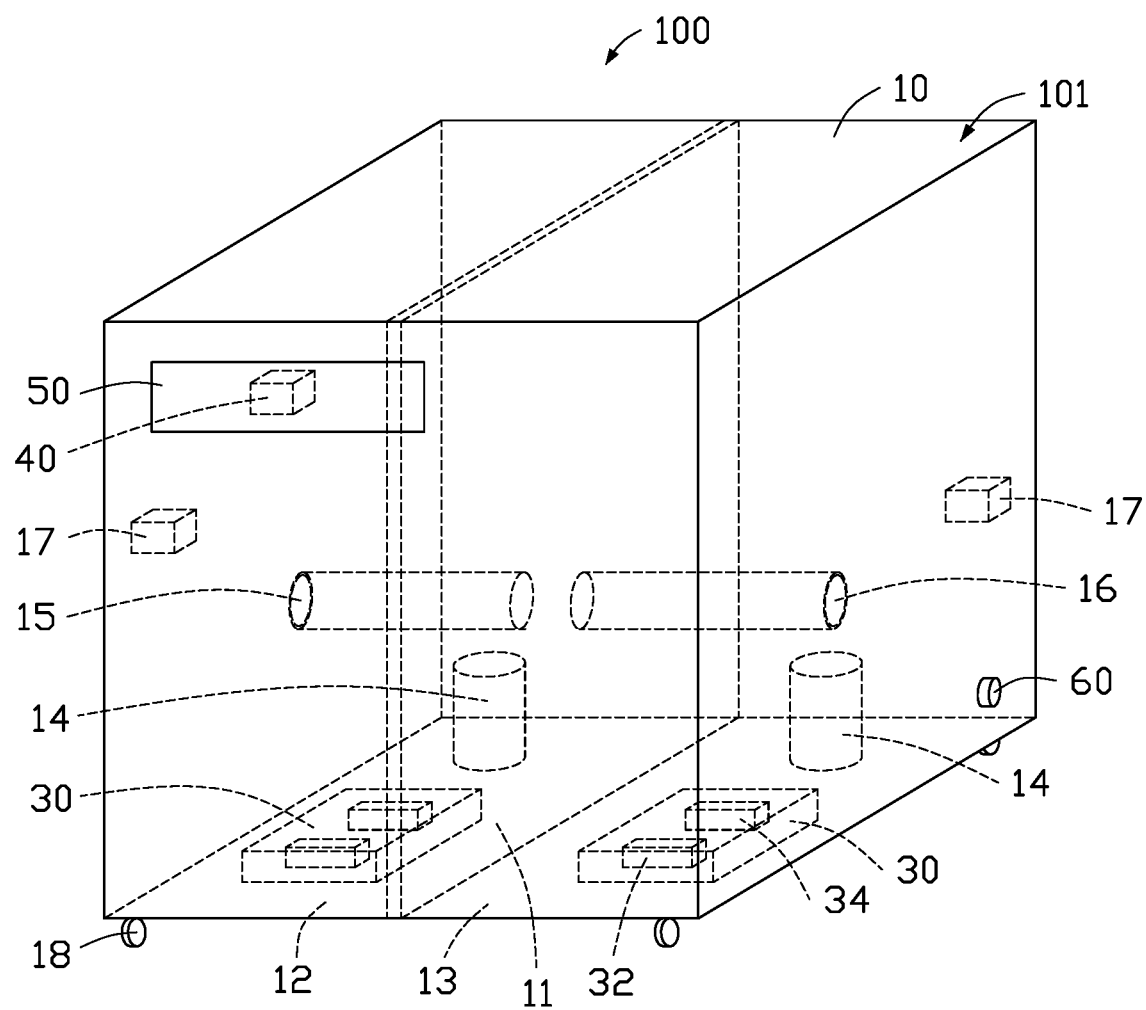
FIG. 1 is an isometric view of a device for administering tests (test device) according to an embodiment of the present disclosure.
Figure 3:
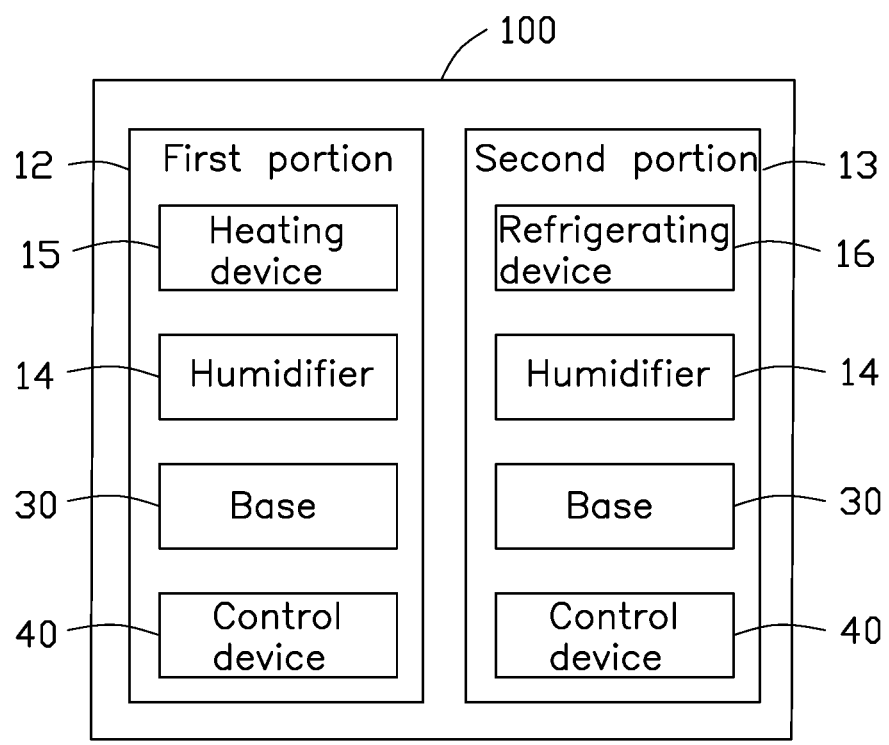
FIG. 3 is a block diagram of a test device according to an embodiment of the present disclosure.

Referring to FIGS. 1 and 3, a device for administering tests (test device 100) is disclosed, the test device 100 is configured to simulate a real use environment of a main board of an electronic device (not shown) and test performances of the electronic device being tested therein. The electronic device can be, but is not limited to, a mobile phone, a computer, or the like. The performance test includes, but is not limited to, testing and/or evaluating real-world conditions as an influence on the main board of the electronic device during charging and discharging, a restarting function of the main board, a state of the main board when being used with a high frequency, and the signal receiving and transmitting functions of the main board. The test device 100 includes a housing 10, one or more humidifiers 14, a heating device 15, a refrigerating device 16, one or more bases 30, one or more control devices 40, and one or more display devices 50.

The housing 10 defines a cavity 101 therein. The housing 10 can be dissassembled, assembled, and sealed. The test device 100 is capable of providing an environment either of high temperature, low temperature, and high and low humidity. The material of the housing 10 can endure high temperature, low temperature, and highly corrosive conditions. In the embodiment, the housing 10 is made of a magnetic plate, the housing 10 has complete sealing and is easily maintained.

The cavity 101 in the housing 10 is divided into a first portion 12 and a second portion 13 by a partition plate 11. The first portion 12 is interconnected with the heating device 15, and the second portion 13 is interconnected with the refrigeration device 16, thereby the first portion 12 can be a high temperature zone and the second portion 13 can be a low temperature zone. The first portion 12 provides a predefined high temperature environment and the second portion 13 provides a predefined low temperature environment.

In the embodiment, the heating device 15 and the refrigerating device 16 can be simultaneously turned on to enhance a working efficiency of the test device 100. The separator 11 can endure high temperature and low temperature and cycling between them. The separator 11 also has a good heat insulation performance. At the same time, the separator 11 has moisture-proof characteristics. The separator 11 can be made of materials such as plastic foam of Ethylene Vinyl Acetate Copolymer (EVA), and coils of insulating aluminum foils.

Figure 2:
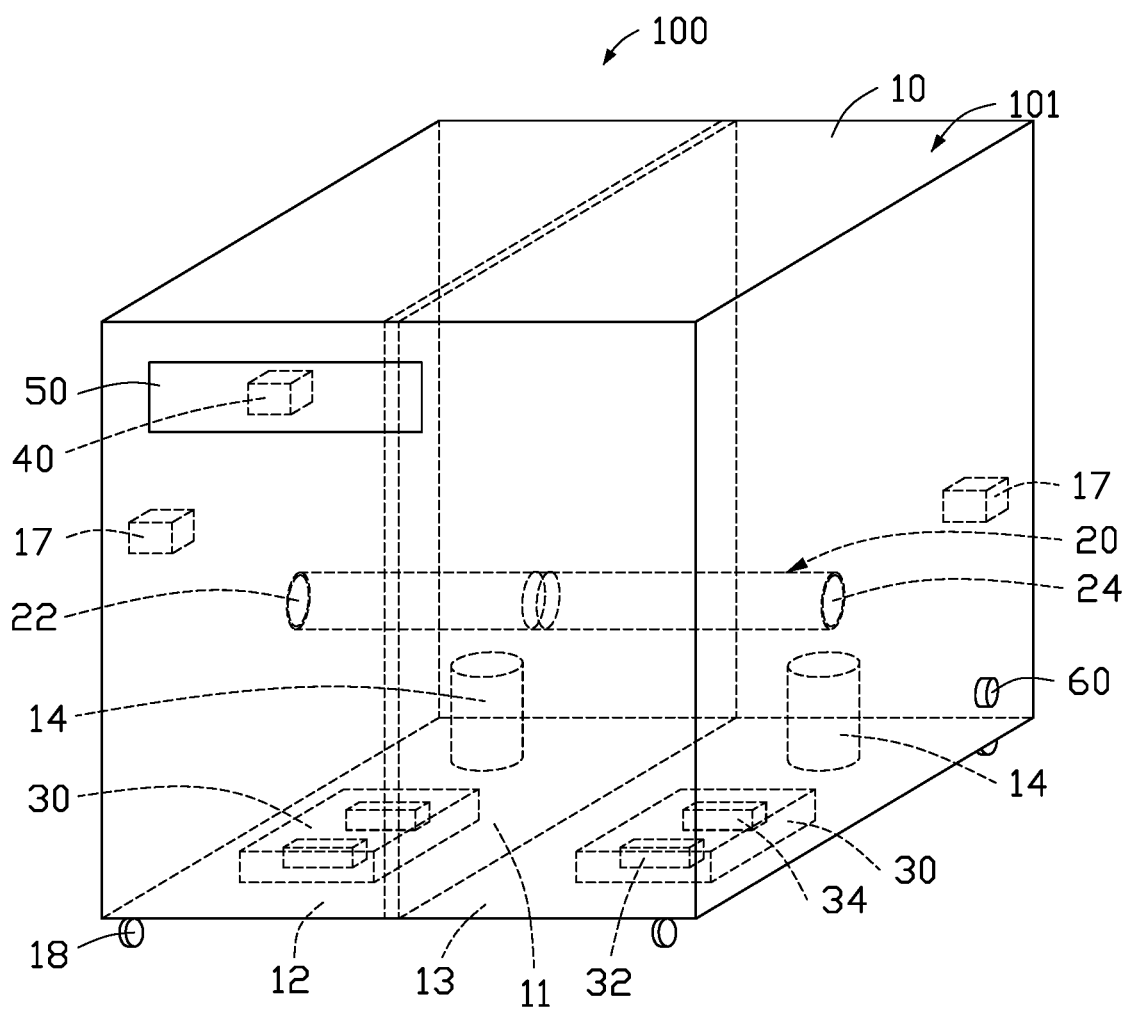
FIG. 2 is an isometric view of a test device according to another embodiment of the present disclosure.

Referring to FIG. 2, in the embodiment, a vortex tube 20 is employed both as the heating device 15 and the refrigerating device 16, thereby achieving a high temperature environment in the first portion 12 and a low temperature environment in the second portion 13.

Specifically, the vortex tube 20 is disposed so as to pass through the partition plate 11. The vortex tube 20 includes a first nozzle 22 disposed in the first portion 12 and a second nozzle 24 disposed in the second portion 13.

The humidifier 14 is interconnected with the first portion 12 and the second portion 13. The humidifier 14 is used to adjust the humidity of the first portion 12 and the second portion 13, thereby providing predefined high and low humidity environments. In the embodiment, there are two humidifiers 14, one of which is disposed inside the first portion 12 and the other is disposed in the second portion 13.

Referring to FIG. 3, the first portion 12 and the second portion 13 are both provided with sensors 17. The sensors 17 in either the first portion 12 or the second portion 13 include a temperature sensor and a humidity sensor. The temperature sensor is configured to sense a temperature value of the temperature in the first portion 12 or the second portion 13 and transmit the sensed temperature value to the control device 40. The humidity sensor is configured to sense a humidity value of the humidity in the first portion 12 or the second portion 13 and transmit the sensed humidity value to the control device 40.

In the embodiment, the test device 100 includes two bases 30. One of the bases 30 is disposed in the first portion 12 and the other is disposed in the second portion 13. Each of the bases 30 is used to carry a main board or other item for testing. Each of the bases 30 includes a detection device 32 for testing the performance of the main board, generating test result data, and transmitting the test result data to the control device 40.

Each of the bases 30 further includes a battery 34. The battery 34 provides power for testing the main board. Furthermore, the battery 34 performs charging and discharging functions to assist the testing in adverse conditions.

The bases 30 are replaceable, thereby being compatible with main boards of different electronic devices. The different electronic devices here refer to electronic devices of different type, of same type but different brands, or of same brand but different models.

In the embodiment, here are two control devices 40. One of the control devices 40 is disposed in the first portion 12 and configured to control the testing in the first portion 12. The other of the control devices 40 is disposed in the second portion 13 and configured to control the testing in the second portion 13. Each of the control devices 40 is configured to transmit a command to begin detection to several components such as the humidifier 14, the heating device 15 or the refrigerating device 16, and the base 30, thereby activating those components for creating an predefined environment and testing a main board. Each of the control devices 40 is further configured to receive data as to testing transmitted from the detection device 32.

In an alternative embodiment, there is only one control device 40. The single control device 40 can be configured to control the testing in the first portion 12 and the second portion 13.

The display device 50 is electrically connected to the control devices 40. The display device 50 can be disposed on the housing 10 of the test device 100, or can be outside of the test device 100. The display device 50 is configured to display data as to test conditions and test results. The display device 50 can be a touch display that is capable of receiving input as well as outputting.

The test device 100 further includes a power supply device 60 electrically connected to powerable components of the test device 100 such as the bases 30, the control devices 40, and the display device 50.

It can be understood that in another embodiments, the test device 100 can be powered by an external power source.

In another embodiment, the test device 100 can be divided into a plurality of first portions 12 and/or a plurality of second portions 13, so that a plurality of electronic devices can be tested simultaneously.

In the embodiment, the test device 100 further includes a plurality of universal wheels 18 that are mounted under the housing 10 to facilitate mobility of the test device 100. Furthermore in the embodiment, the test device 100 is a rectangular parallelepiped structure, and has a universal wheel 18 at each bottom corner.

A working principle of the test device 100 is:

A main board to be tested is placed on the base 30 in the first portion 12 or in the second portion 13, and electrically connected to the base 30. The temperature and humidity in the portion 12 or 13 are set via the display device 50. The control device 40 activates the heating device 15 or the refrigeration device 16 to heat or cool the portion 12 or the portion 13 to reach a preset value, and activates the humidifier 14 to cause a humidity in such portions to reach a preset value. After the temperature and the humidity in the portion 12 or 13 reaches the preset values, the control device 40 controls the test device 100 to test the performance of the main board, to obtain data as to result and display the data on the display device 50.

In an embodiment, the temperature in the first portion 12 is set to be 50° C., and the humidity is set to be 90%. The temperature of the main board is detected after the battery 34 is charged and discharged for 500 times.

In another embodiment, the temperature in the second portion 13 is set to be −5° C., and the humidity is set to be 90%. The temperature of the main board is detected after the battery 34 is charged and discharged for 500 times.

The test device 100 provided by the present disclosure simulates the conditions of use in a real environment by setting and adjusting different temperature environments and humidity environments, to test the performance of the main board. The test device 100 has a first portion simulating a preset high temperature environment and has a second portion simulating a preset low temperature environment, two different electronic devices can be tested at the same time and improve a work efficiency of the test device 100.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims.

What is claimed is:

1. A test device for testing performances of main boards, the test device comprising a housing, two bases, two control devices, two humidifiers, a heating device and a refrigerating device, wherein the housing defines a cavity, the cavity comprises a first portion and a second portion spaced apart from each other, the heating device is interconnected with the first portion, and configured to create a predefined high temperature environment in the first portion, the refrigerating device is interconnected with the second portion, and configured to create a predefined low temperature environment in the second portion, one humidifier is interconnected with the first portion, the other humidifier is interconnected with the second portion, the humidifiers are configured to create predefined degrees of humidity respectively in the first portion and the second portion, the bases are respectively disposed inside the first portion and the second portion, the control devices are respectively disposed inside the first portion and the second portion and electrically connected to the bases respectively.

2. The test device according to claim 1, wherein a vortex tube serves as both the heating device and the refrigerating device.

3. The test device according to claim 2, wherein the vortex tube comprises a first nozzle and a second nozzle, the first nozzle is disposed in the first portion to create the predefined high temperature environment in the first portion, and the second nozzle is disposed in the second portion to create the predefined low temperature environment in the second portion.

4. The test device according to claim 2, wherein each of the bases comprises a detection device for testing the performance of the main boards, generating test result data and transmitting the test result data to one control device, each of the bases further comprises a battery providing power for testing of the main boards.

5. The test device according to claim 2, wherein the test device comprises a display device electrically connected to the control devices.

6. The test device according to claim 2, wherein the first portion and the second portion are separated by a separator, and the separator is made of plastic foam of ethylene-vinyl acetate copolymer or coils of insulating aluminum foils.

7. The test device according to claim 2, wherein the test device further comprises sensors disposed in the first portion and the second portion, the sensors in the first portion or the second portion comprise a temperature sensor and a humidity sensor.

8. The test device according to claim 1, wherein each of the bases comprises a detection device for testing performances of the main boards, generating test result data, and transmitting the test result data to one control device, each of the bases further comprises a battery providing power for testing of the main boards.

9. The test device according to claim 1, wherein the test device comprises a display device electrically connected to the control devices.

10. The test device according to claim 9, wherein the display device is disposed on the housing or outside of the test device.

11. The test device according to claim 10, wherein the test device further comprises a power supply device for powering the bases, the control devices and the display device.

12. The test device according to claim 1, wherein the first portion and the second portion are separated by a separator, and the separator is made of plastic foam of ethylene-vinyl acetate copolymer or coils of insulating aluminum foils.

13. The test device according to claim 1, wherein the test device further comprises sensors disposed in the first portion and the second portion, the sensors in the first portion or the second portion comprise a temperature sensor and a humidity sensor.

14. The test device according to claim 1, further comprising universal wheels mounted under the housing for mobility of the test device.

\* \* \* \* \*